United States Patent
Kiyama

(10) Patent No.: US 9,607,870 B2
(45) Date of Patent: Mar. 28, 2017

(54) HEAT TREATMENT APPARATUS AND HEAT TREATMENT METHOD FOR HEATING SUBSTRATE BY IRRADIATING SUBSTRATE WITH FLASH OF LIGHT

(71) Applicant: DAINIPPON SCREEN MFG. CO., LTD., Kyoto (JP)

(72) Inventor: Hiroki Kiyama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 395 days.

(21) Appl. No.: 14/142,991

(22) Filed: Dec. 30, 2013

(65) Prior Publication Data

US 2014/0206108 A1    Jul. 24, 2014

(30) Foreign Application Priority Data

Jan. 24, 2013   (JP) .................................. 2013-010836

(51) Int. Cl.
*F26B 3/30* (2006.01)
*A45D 20/40* (2006.01)
(Continued)

(52) U.S. Cl.
CPC ...... *H01L 21/67248* (2013.01); *H01L 21/324* (2013.01); *H01L 21/67115* (2013.01)

(58) Field of Classification Search
None
See application file for complete search history.

(56) References Cited

U.S. PATENT DOCUMENTS 5,620,624 A * 4/1997 Westerberg ............. A47J 27/62
                                                219/411
5,781,693 A * 7/1998 Ballance ........... C23C 16/45565
                                                118/724
(Continued)

FOREIGN PATENT DOCUMENTS

JP          S61-198735         9/1986
JP          S63-188940         8/1988
(Continued)

OTHER PUBLICATIONS

Office Action issued by Taiwanese Patent Office on Mar. 24, 2015 in connection with corresponding Taiwanese Application No. 10-102142333 with English Translation thereof.
(Continued)

*Primary Examiner* — Thor Campbell
(74) *Attorney, Agent, or Firm* — Ostrolenk Faber LLP

(57) ABSTRACT

A flash heating part in a heat treatment apparatus includes 30 built-in flash lamps, and irradiates a semiconductor wafer held by a holder in a chamber with a flash of light. Thirty switching elements are provided in a one-to-one correspondence with the 30 flash lamps. Each of the switching elements defines the waveform of current flowing through a corresponding one of the flash lamps by intermittently supplying electrical charge thereto. Radiation thermometers measure an in-plane temperature distribution of the semiconductor wafer during flash irradiation. Based on the results of measurement with the radiation thermometers, a controller individually controls the operations of the 30 switching elements to individually define the light emission patterns of the 30 flash lamps.

4 Claims, 12 Drawing Sheets

(51) Int. Cl.
*H01L 21/67* (2006.01)
*H01L 21/324* (2006.01)

(56) References Cited

U.S. PATENT DOCUMENTS

| | | | | |
|---|---|---|---|---|
| 6,090,210 | A * | 7/2000 | Ballance | C23C 16/45565 118/50.1 |
| 6,614,005 | B1 | 9/2003 | Walk et al. | 219/390 |
| 6,798,142 | B2 | 9/2004 | Eguchi | |
| 7,103,271 | B2 * | 9/2006 | Kanazaki | H01L 21/67248 118/501 |
| 8,050,546 | B2 | 11/2011 | Kusuda | 392/418 |
| 8,229,290 | B2 | 7/2012 | Kusuda | 392/418 |
| 8,447,177 | B2 | 5/2013 | Kusuda | 392/418 |
| 8,952,297 | B2 * | 2/2015 | He | 118/728 |
| 2003/0132692 | A1 | 7/2003 | Eguchi | |
| 2008/0050104 | A1 * | 2/2008 | Mizukawa | H01K 1/16 392/416 |
| 2009/0067823 | A1 | 3/2009 | Kusuda | |
| 2012/0261400 | A1 | 10/2012 | Kusuda | 219/395 |
| 2012/0288261 | A1 | 11/2012 | Hashimoto et al. | |
| 2013/0224967 | A1 | 8/2013 | Kusuda | 438/795 |

FOREIGN PATENT DOCUMENTS

| | | |
|---|---|---|
| JP | 2003-173983 | 6/2003 |
| JP | 2003-197555 | 7/2003 |
| JP | 2010-238804 | 10/2010 |
| JP | 2012-199470 | 10/2012 |
| JP | 2012-238782 | 12/2012 |
| TW | 2009-26302 | 1/2006 |

OTHER PUBLICATIONS

Japanese Office Action (JP Application No. 2013-010836) dated Oct. 4, 2016 and its English translation.

* cited by examiner

F I G. 2
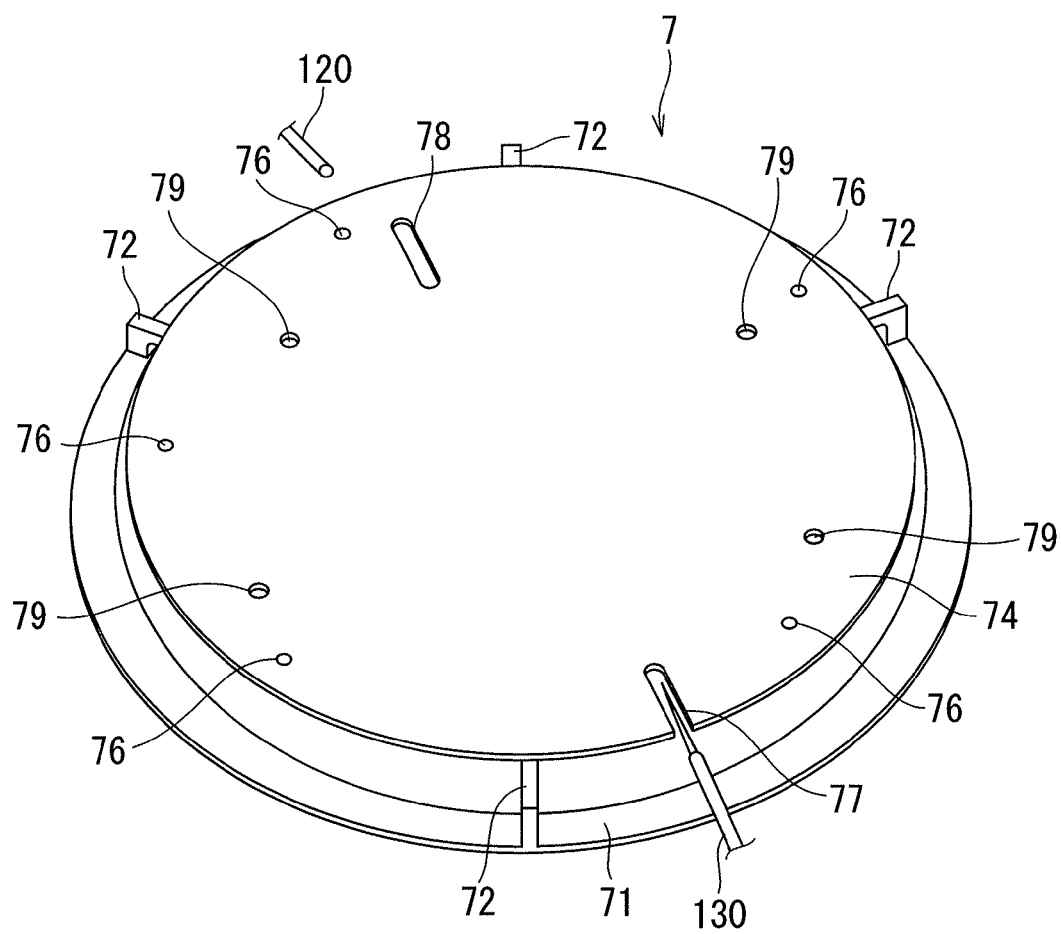

F I G. 3
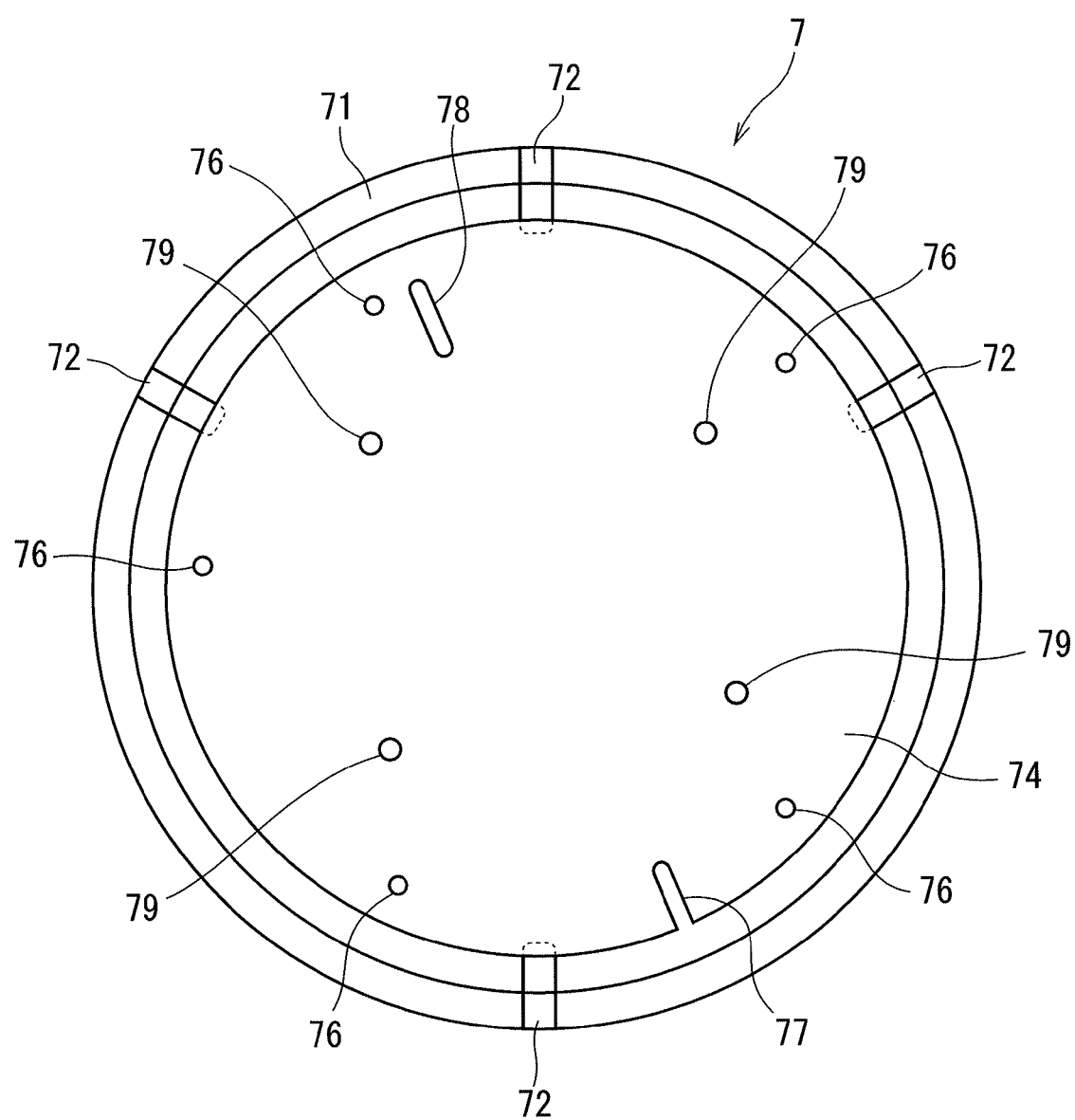

F I G. 4
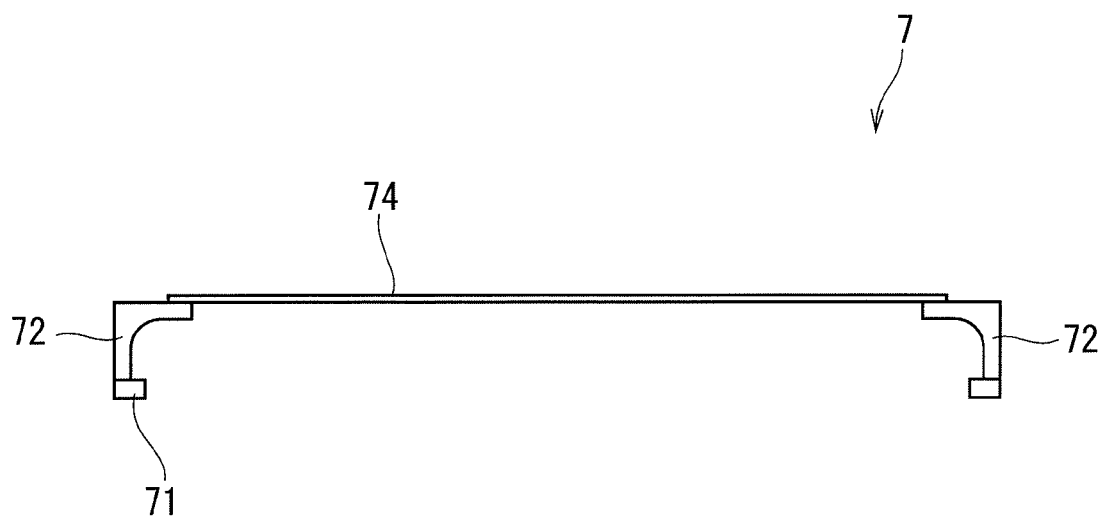

F I G. 7
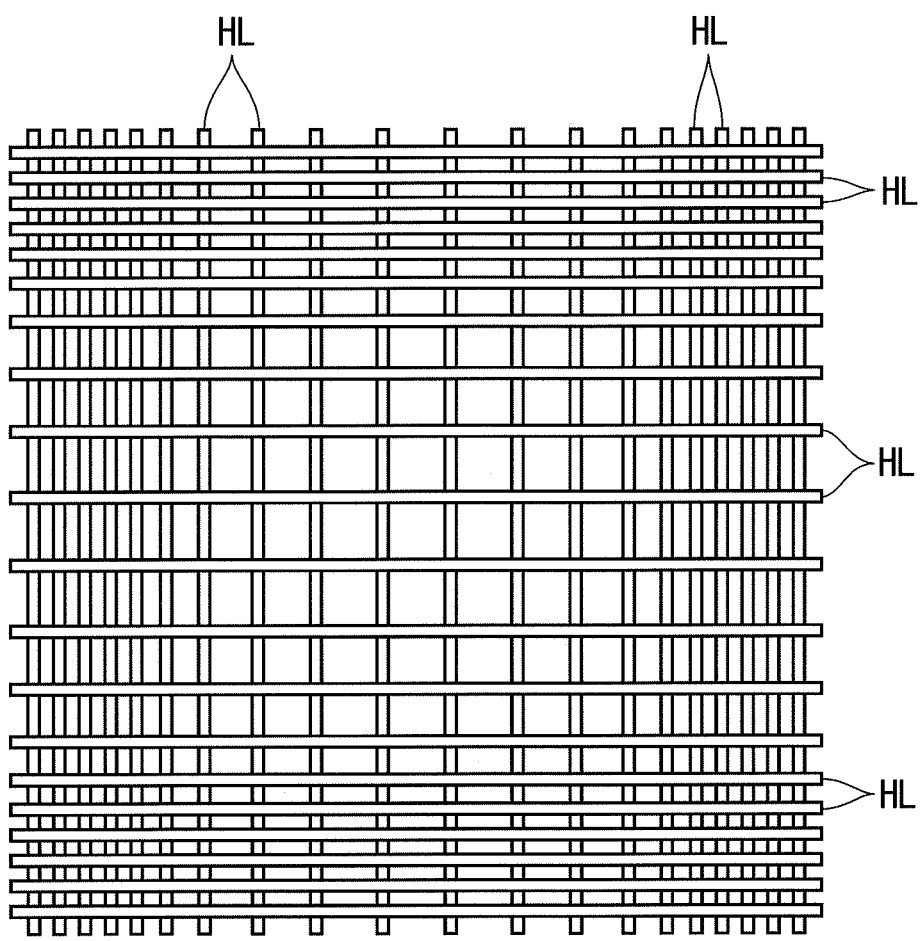

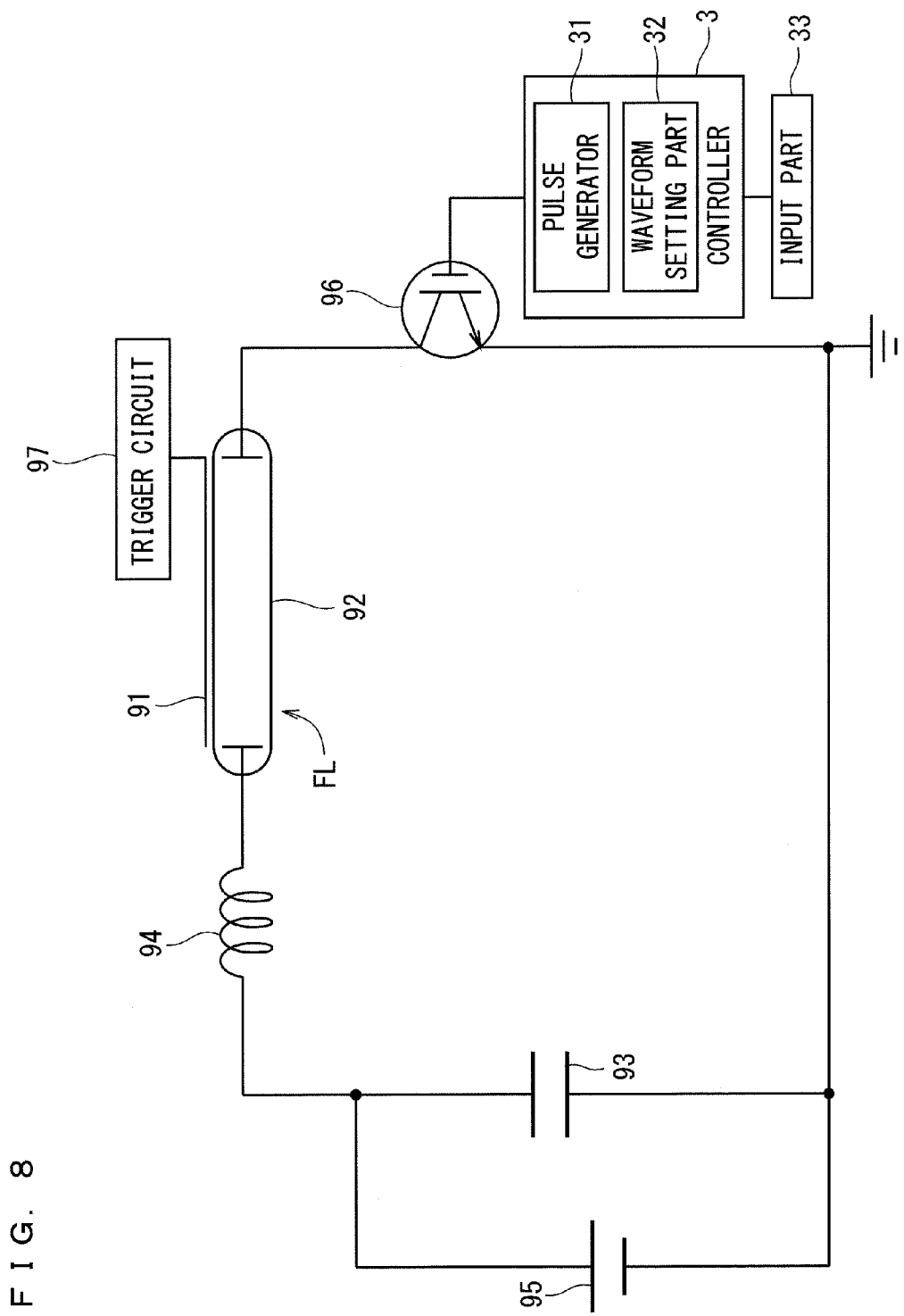
F I G. 8

HEAT TREATMENT APPARATUS AND HEAT TREATMENT METHOD FOR HEATING SUBSTRATE BY IRRADIATING SUBSTRATE WITH FLASH OF LIGHT

BACKGROUND OF THE INVENTION

Field of the Invention

The present invention relates to a heat treatment apparatus and a heat treatment method for heating a thin plate-like precision electronic substrate such as a semiconductor wafer and a glass substrate for a liquid crystal display device (hereinafter referred to simply as a "substrate") by irradiating the substrate with a flash of light.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer of silicon with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

Heat treatment apparatuses which employ such xenon flash lamps are disclosed in U.S. Patent Application Publication Nos. 2009/0067823 and 2009/0103906 in which an insulated gate bipolar transistor (IGBT) is connected to a light emitting circuit for a flash lamp to control the light emission from the flash lamp. In the apparatuses disclosed in U.S. Patent Application Publication Nos. 2009/0067823 and 2009/0103906, a predetermined pulse signal is outputted to the gate of the IGBT to define the waveform of current flowing through the flash lamp, thereby controlling the light emission from the lamp. This achieves the adjustment of the temperature profile of the front surface of a semiconductor wafer.

In the apparatuses disclosed in U.S. Patent Application Publication Nos. 2009/0067823 and 2009/0103906, 30 IGBTs are provided in a one-to-one correspondence with 30 flash lamps, and a common pulse signal is outputted to the 30 IGBTs. Thus, currents having the same waveform flow through the 30 flash lamps, so that the 30 flash lamps emit light in a similar fashion.

Even if a plurality of flash lamps emit light in a similar fashion, an actual flash lamp annealer has a problem such that nonuniformity in illuminance coming from an apparatus configuration problem results in the nonuniform in-plane temperature distribution of a semiconductor wafer during flash irradiation. In general, a semiconductor wafer W shows a tendency to be lower in temperature in a peripheral portion thereof than near a central portion thereof.

SUMMARY OF THE INVENTION

The present invention is intended for a heat treatment apparatus for heating a substrate by irradiating the substrate with a flash of light.

According to one aspect of the present invention, the heat treatment apparatus comprises: a chamber for receiving a substrate therein; a holder for holding the substrate in the chamber; a plurality of flash lamps for irradiating the substrate held by the holder with a flash of light; a plurality of switching elements provided in a one-to-one correspondence with the flash lamps and each defining the waveform of current flowing through a corresponding one of the flash lamps; and a light emission controller for individually controlling the operations of the switching elements to individually define the light emission patterns of the flash lamps.

The heat treatment apparatus causes the illuminance of flash lamps corresponding to a region where illuminance is insufficient to become relatively high, thereby achieving the uniform in-plane temperature distribution of the substrate during flash irradiation.

Preferably, the heat treatment apparatus further comprises a plurality of temperature sensors for measuring the temperatures of different regions, respectively, of a front surface of the substrate held by the holder, and the light emission controller controls the operations of the switching elements, based on results of measurement with the temperature sensors.

The heat treatment apparatus causes the illuminance of a flash of light in a region of the substrate where a temperature decrease occurs to become relatively high, thereby achieving the uniform in-plane temperature distribution of the substrate during flash irradiation.

Preferably, the heat treatment apparatus further comprises a plurality of illuminance sensors for measuring the illuminances of different regions, respectively, of the arrangement of the flash lamps, and the light emission controller controls the operations of the switching elements, based on results of measurement with the illuminance sensors.

The heat treatment apparatus causes the illuminance of a flash of light from a region of the arrangement where illuminance is low to become relatively high, thereby achieving the uniform in-plane temperature distribution of the substrate during flash irradiation.

The present invention is also intended for a method of heating a substrate by irradiating the substrate with a flash of light.

According to one aspect of the present invention, the method comprises the step of individually controlling the operations of a plurality of switching elements provided in a one-to-one correspondence with a plurality of flash lamps for emitting a flash of light and each defining the waveform of current flowing through a corresponding one of the flash lamps, to individually define the light emission patterns of the flash lamps.

The method causes the illuminance of flash lamps corresponding to a region where illuminance is insufficient to become relatively high, thereby achieving the uniform in-plane temperature distribution of the substrate during flash irradiation.

Preferably, the operations of the switching elements are controlled, based on results of measurement of temperatures of different regions, respectively, of a front surface of a substrate irradiated with a flash of light.

The method causes the illuminance of a flash of light in a region of the substrate where a temperature decrease occurs to become relatively high, thereby achieving the uniform in-plane temperature distribution of the substrate during flash irradiation.

Preferably, the operations of the switching elements are controlled, based on results of measurement of illuminances of different regions, respectively, of the arrangement of the flash lamps.

The method causes the illuminance of a flash of light from a region of the arrangement where illuminance is low to become relatively high, thereby achieving the uniform in-plane temperature distribution of the substrate during flash irradiation.

It is therefore an object of the present invention to achieve a uniform in-plane temperature distribution of a substrate during flash irradiation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 3 is a top plan view of the holder;

FIG. 4 is a side view of the holder as seen from one side;

FIG. 7 is a plan view showing an arrangement of halogen lamps;

FIG. 8 is a diagram showing a light emitting circuit for a flash lamp;

DESCRIPTION OF THE PREFERRED EMBODIMENTS

Figure 1:
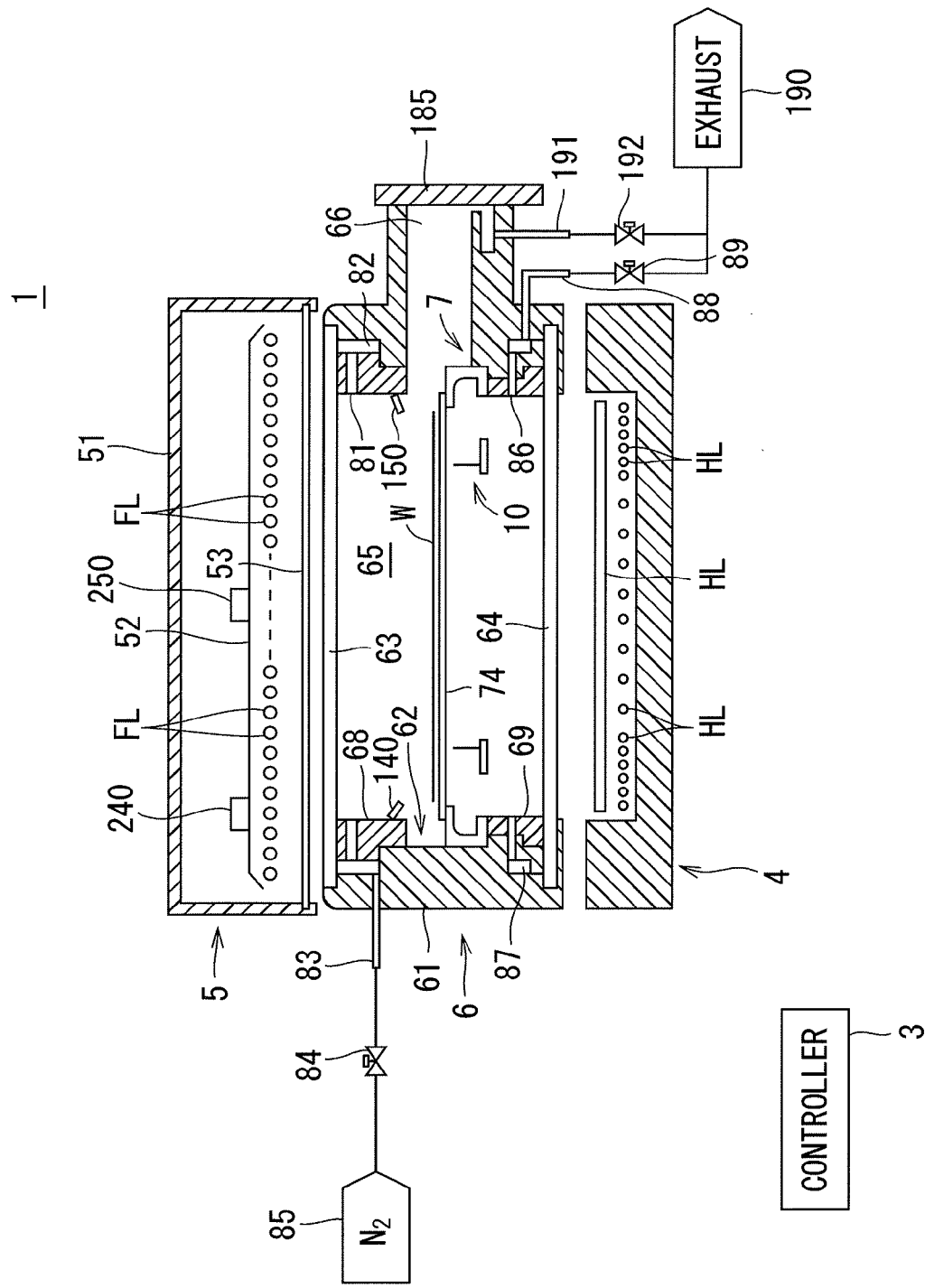
FIG. 1 is a longitudinal sectional view showing a configuration of a heat treatment apparatus according to the present invention.

Preferred embodiments according to the present invention will now be described in detail with reference to the drawings. In FIG. 1 and the subsequent figures, the dimensions of components and the number of components are shown in exaggeration or in simplified form, as appropriate, for the sake of easier understanding.

First Preferred Embodiment

FIG. 1 is a longitudinal sectional view showing a configuration of a heat treatment apparatus 1 according to the present invention. The heat treatment apparatus 1 according to a first preferred embodiment of the present invention is a flash lamp annealer for irradiating a disk-shaped semiconductor wafer W serving as a substrate with a flash of light to heat the semiconductor wafer W. The size of the semiconductor wafer W to be treated is not particularly limited. For example, the semiconductor wafer W to be treated has a diameter of 300 mm and 450 mm. The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The susceptor 74 having a planar shape is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in the present preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal attitude (an attitude such that the normal to the susceptor 74 coincides with a vertical direction). A semiconductor wafer W transported into the chamber 6 is placed and held in a horizontal attitude on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 5:
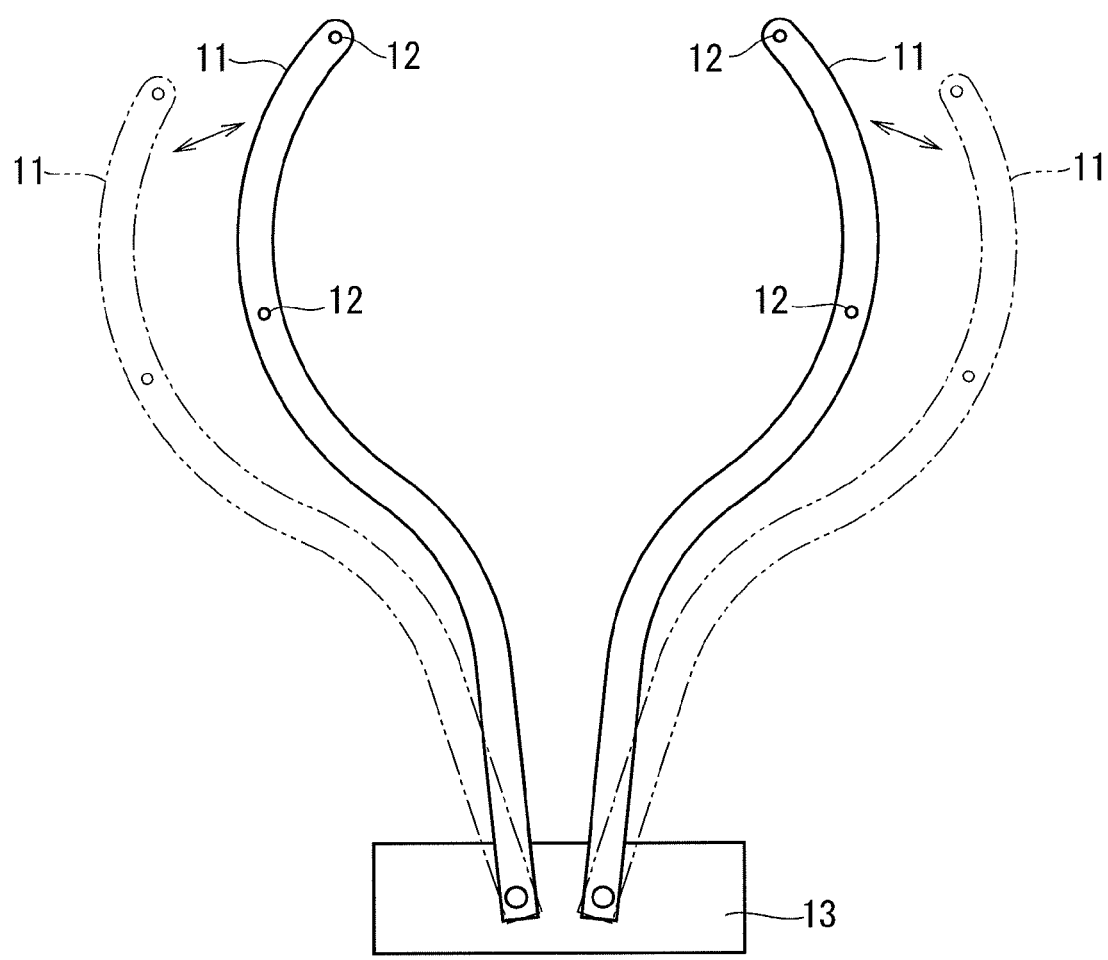
FIG. 5 is a plan view of a transfer mechanism.
Figure 6:
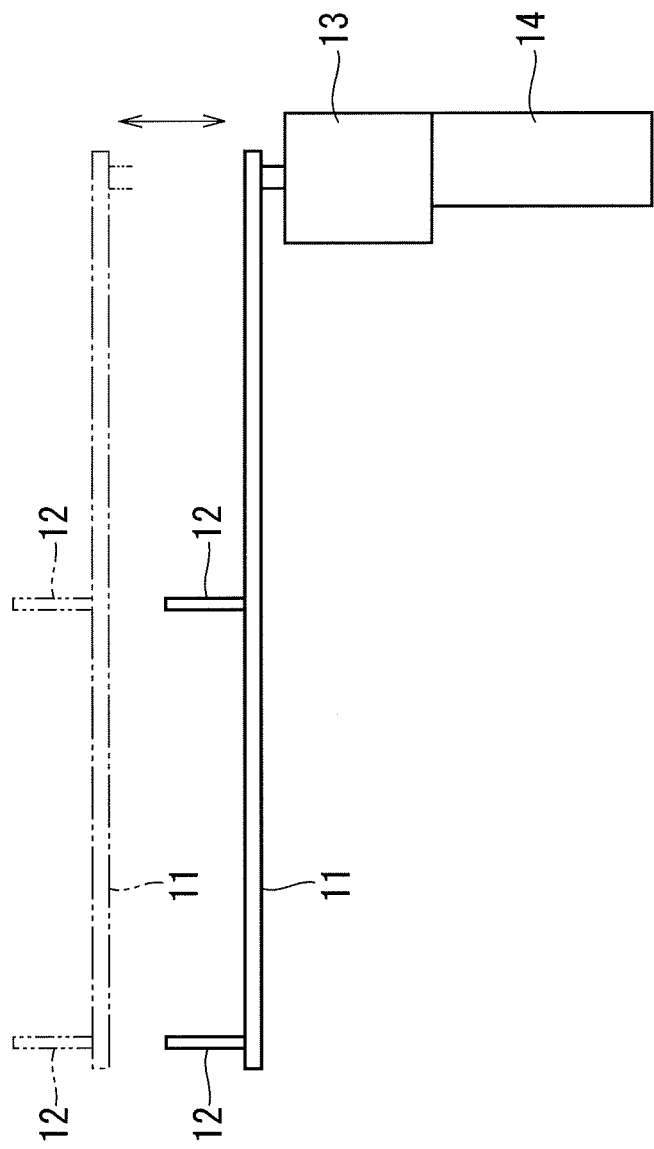
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, two radiation thermometers 140 and 150 are provided inside the chamber 6. While the radiation thermometer 120 described above (FIG. 2) measures the temperature of the lower surface of the semiconductor wafer W, the radiation thermometers 140 and 150 are temperature sensors for measuring the temperature of the upper surface of the semiconductor wafer W. The radiation thermometers 140 and 150 are provided above the susceptor 74 of the holder 7. The radiation thermometers 140 and 150 are also provided obliquely above the semiconductor wafer W held by the holder 7 so as not to be obstacles to the flash irradiation from the flash lamps FL. The radiation thermometers 140 and 150 may be provided inside the recessed portion 62.

Each of the radiation thermometers 140 and 150 includes a fast-response infrared photodetection element. The wavelength range measured by the infrared photodetection elements of the radiation thermometers 140 and 150 is preferably a wavelength range to which the material (in this preferred embodiment, quartz) of the upper chamber window 63 and the lower chamber window 64 is not pervious. The radiation thermometers 140 and 150 receive infrared radiation emitted from the upper surface of the semiconductor wafer W held by the holder 7 to measure the temperature of the upper surface of the wafer W, based on the intensity (the amount of energy) of the infrared radiation.

The radiation thermometer 140 and the radiation thermometer 150 are different from each other in temperature measurement region on the upper surface of the semiconductor wafer W. The radiation thermometer 140 detects infrared radiation emitted from a peripheral portion of the semiconductor wafer W held by the holder 7 to measure the temperature of the peripheral portion. The radiation thermometer 150, on the other hand, detects infrared radiation emitted from the vicinity of a central portion of the semiconductor wafer W held by the holder 7 to measure the temperature of the vicinity of the central portion. The number of radiation thermometers which measure the temperature of the upper surface of the semiconductor wafer W is not limited to two, but may be three or more. For example, another radiation thermometer for measuring the temperature of an intermediate region between the peripheral portion and the central portion of the semiconductor wafer W may be provided in addition to the radiation thermometers 140 and 150. Alternatively, another radiation thermometer may be provided which measures the temperature of a peripheral portion of the semiconductor wafer W different from the peripheral portion whose temperature is measured by the radiation thermometer 140. It is only necessary that at least two radiation thermometers which measure the temperatures of different regions of the upper surface of the semiconductor wafer W held by the holder 7 are provided.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

FIG. 8 is a diagram showing a light emitting circuit for each flash lamp FL. As shown in FIG. 8, a capacitor 93, a coil 94, and a switching element 96 are connected in series with a flash lamp FL. An example of the switching element 96 used herein includes an IGBT (insulated-gate bipolar transistor). Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33 or a computation processing result of the controller 3. The pulse generator 31 generates the pulse signal in accordance with the waveform sets by the waveform setting part 32.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A trigger circuit 97 is capable of applying a high voltage to the trigger electrode 91. The timing of the voltage application from the trigger circuit 97 to the trigger electrode 91 is controlled by the controller 3.

In the light emitting circuit for the flash lamps FL, a charging unit (charging part) 95 is connected in parallel with the capacitor 93. The charging unit 95 applies a predetermined voltage to the capacitor 93, so that the capacitor 93 is charged in accordance with the applied voltage (charging voltage). The charging voltage applied from the charging unit 95 to the capacitor 93 is controlled by the controller 3.

The IGBT used as the switching element 96 is a bipolar transistor which includes a MOSFET (metal-oxide-semiconductor field-effect transistor) incorporated in the gate thereof, and is suitable for handling a large amount of power. The pulse generator 31 in the controller 3 applies the pulse signal to the gate of the IGBT serving as the switching element 96. When a voltage ("high" voltage) not less than a predetermined level is applied to the gate of the switching element 96, the switching element 96 turns on. When a voltage ("low" voltage) less than the predetermined level is applied to the gate of the switching element 96, the switching element 96 turns off. In this manner, the light emitting circuit including the flash lamp FL is turned on and off by the switching element 96. By turning the switching element 96 on and off, a connection between the flash lamp FL and the capacitor 93 corresponding thereto is made and broken.

Even if, with the capacitor 93 in the charged state, the switching element 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

The light emitting circuit shown in FIG. 8 is provided for each of the 30 flash lamps FL. That is, 30 switching elements 96, 30 capacitors 93 and 30 coils 94 are provided in a one-to-one correspondence with the 30 flash lamps. Also, 30 charging units 95 are provided in a one-to-one correspondence with the 30 capacitors 93.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting.

Two illuminance sensors 240 and 250 are provided on an upper surface (a surface opposite from the flash lamps FL) of the reflector 52. Small holes are formed in parts of the reflector 52 where the illuminance sensors 240 and 250 are provided. The illuminance sensors 240 and 250 receive light emitted from the flash lamps FL through the small holes of the reflector 52. Each of the illuminance sensors 240 and 250 includes a fast-response photodiode, for example, to measure the illuminance of light emitted from the flash lamps FL.

The illuminance sensor 240 and the illuminance sensor 250 are different from each other in illuminance measurement region in the arrangement of the 30 flash lamps FL. The illuminance sensor 240 is provided over the vicinity of an edge portion of the arrangement of the 30 flash lamps FL to measure the illuminance of flashes of light in the vicinity of the edge portion. The illuminance sensor 250, on the other hand, is provided over the vicinity of a central portion of the arrangement of the 30 flash lamps FL to measure the illuminance of flashes of light in the vicinity of the central portion. The number of illuminance sensors is not limited to two, but may be three or more. For example, another illuminance sensor for measuring the illuminance in an intermediate region between the edge portion and the central portion of the arrangement of the 30 flash lamps FL may be provided in addition to the illuminance sensors 240 and 250. It is only necessary that at least two illuminance sensors which measure the illuminance in different regions of the arrangement of the 30 flash lamps FL are provided.

The multiple (in the present preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In the present preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the edge portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 of the controller 3 sets the waveform of the pulse signal, and the pulse generator 31 outputs the pulse signal to the gate of the switching element 96 in accordance with the waveform. Further, the controller 3 controls the charging voltage applied from the charging unit 95 to the capacitor 93.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate of silicon in which impurities (ions) are introduced by an ion implantation process. The introduced impurities are activated by the heat treatment apparatus 1 performing the process of heating (annealing) the semiconductor wafer W by flash irradiation. The procedure for treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports the semiconductor wafer W subjected to the ion implantation through the transport opening 66 into the heat treatment space 65 of the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude. The semiconductor wafer W is held on the susceptor 74 in such an attitude that the ion-implanted surface thereof is the upper surface. Also, the semiconductor wafer W is held inside the five guide pins 76 on the upper surface of the susceptor 74.

The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the back surface of the semiconductor wafer W. The back surface of the semiconductor wafer W refers to a main surface thereof on opposite side from the front surface subjected to the ion implantation. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become obstacles to the heating using the halogen lamps HL.

Figure 9:
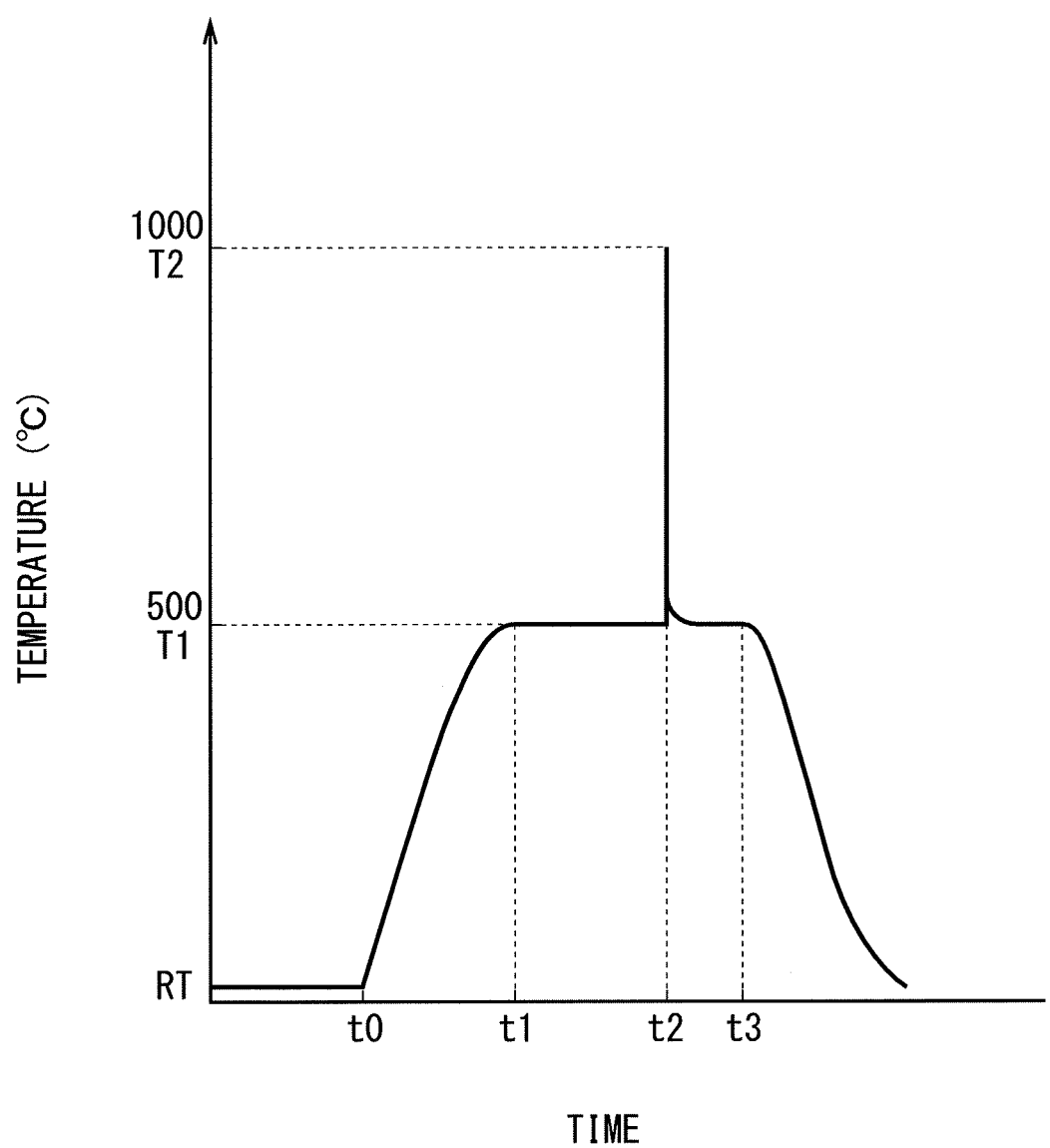
FIG. 9 is a graph showing changes in the temperature of the front surface of a semiconductor wafer.

FIG. 9 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0 to increase the temperature of the semiconductor wafer W irradiated with the halogen light to a preheating temperature T1 of 800° C. or below (in the present preferred embodiment, 500° C.).

The temperature of the semiconductor wafer W is measured with the contact-type thermometer 130 when the halogen lamps HL perform the preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 exercises feedback control of the output from the halogen lamps HL, based on the value measured with the contact-type thermometer 130, so that the temperature of the semiconductor wafer W is equal to the preheating temperature T1.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is more liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a flash heating treatment at time t2 when a predetermined time period has elapsed since the temperature of the semiconductor wafer W reached the preheating temperature T1. It should be noted that a time period required for the temperature of the semiconductor wafer W at room temperature to reach the preheating temperature T1 (a time interval between the time t0 and the time t1) is only on the order of several seconds, and that a time period required between the instant at which the temperature of the semiconductor wafer W reaches the preheating temperature T1 and the instant at which the flash lamps FL emit a flash of light (a time interval between the time t1 and the time t2) is also only on the order of several seconds. For the flash irradiation from each flash lamp FL, the capacitor 93 is charged in advance by the charging unit 95. Then, with the capacitor 93 in the charged state, the pulse generator 31 in the controller 3 outputs a pulse signal to the switching element 96 to drive the switching element 96 on and off.

The waveform of the pulse signal is defined by inputting from the input part 33 a recipe that is a sequence of defined parameters including a time interval (ON time interval) equivalent to the pulse width and a time interval (OFF time interval) between pulses. After an operator inputs such a recipe from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32. As a result, the pulse signal having the set waveform is applied to the gate of the switching element 96 to control the driving on and off of the switching element 96. Specifically, the switching element 96 is on when the pulse signal inputted to the gate of the switching element 96 is on, and the switching element 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the switching element 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The flash lamps FL emit light at the time t2 in this manner, so that the front surface of the semiconductor wafer W held by the holder 7 is irradiated with a flash of light. If a flash lamp FL emits light without using the switching element 96, the electrical charges stored in the capacitor 93 are consumed by the single light emission, so that the output waveform from the flash lamp FL exhibits a single pulse having a width on the order of 0.1 to 10 milliseconds. On the other hand, the switching element 96 is connected in the circuit and the pulse signal is outputted to the gate of the switching element 96 according to the present preferred embodiment. Thus, the switching element 96 intermittently supplies the electrical charges from the capacitor 93 to the flash lamp FL to control the current flowing to the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current flowing in the circuit reaches exactly zero, the next pulse is applied to the gate of the switching element 96 to increase the current value again. For this reason, the emission output never reaches exactly zero even while the flash lamp FL repeatedly flashes on and off. Thus, the switching element 96 intermittently supplies the electrical charges to the flash lamp FL to freely define the waveform of current flowing to the flash lamp FL. As a result, this freely defines the light emission pattern of the flash lamp FL to freely adjust the light emission time and the light emission intensity. The maximum light emission time of the flash lamp FL is not greater than one second.

In the first preferred embodiment, the 30 flash lamps FL are provided in the flash heating part 5, and the 30 switching elements 96 are provided in a one-to-one correspondence with the 30 flash lamps FL. The waveform setting part 32 of the controller 3 individually sets the pulse waveforms for the 30 switching elements 96, and the pulse generator 31 individually outputs the pulse signals to the 30 switching elements 96. That is, the pulse signals inputted to the 30 switching elements 96 are independent of each other. The pulse signals having the same waveform may be inputted to the 30 switching elements 96 at the same time or the pulse signals having waveforms different from each other may be inputted to the 30 switching elements 96. As a result, the operations of the 30 switching elements 96 are individually controlled independently of each other, so that the light emission patterns of the 30 flash lamps FL are individually defined.

Figure 10:
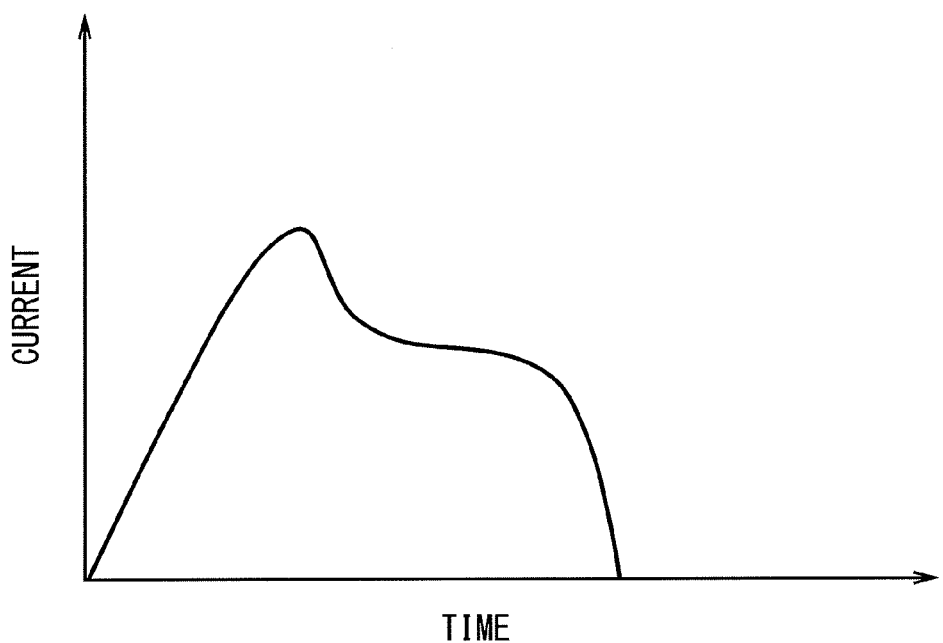
FIG. 10 is a graph showing an example of the waveform of current flowing through flash lamps.

FIG. 10 is a graph showing an example of the waveform of current flowing through each of the flash lamps FL when the pulse signals having the same waveform are inputted to the 30 switching elements 96 at the same time. The operation of each switching element 96 is driven on and off in accordance with the waveform of the pulse signal inputted to the gate of each switching element 96, so that the waveform of current flowing through a flash lamp FL corresponding to each switching element 96 is defined. The waveform of current as shown in FIG. 10 is defined by appropriately setting the waveform of the pulse signal inputted to each switching element 96 (specifically, by setting the number of pulses, the ON time interval of each pulse, and a time interval between pulses). In the example shown in FIG. 10, the currents flowing through the 30 flash lamps FL have the same waveform because the pulse signals having the same waveform are inputted to the 30 switching elements 96 at the same time.

Figure 11:
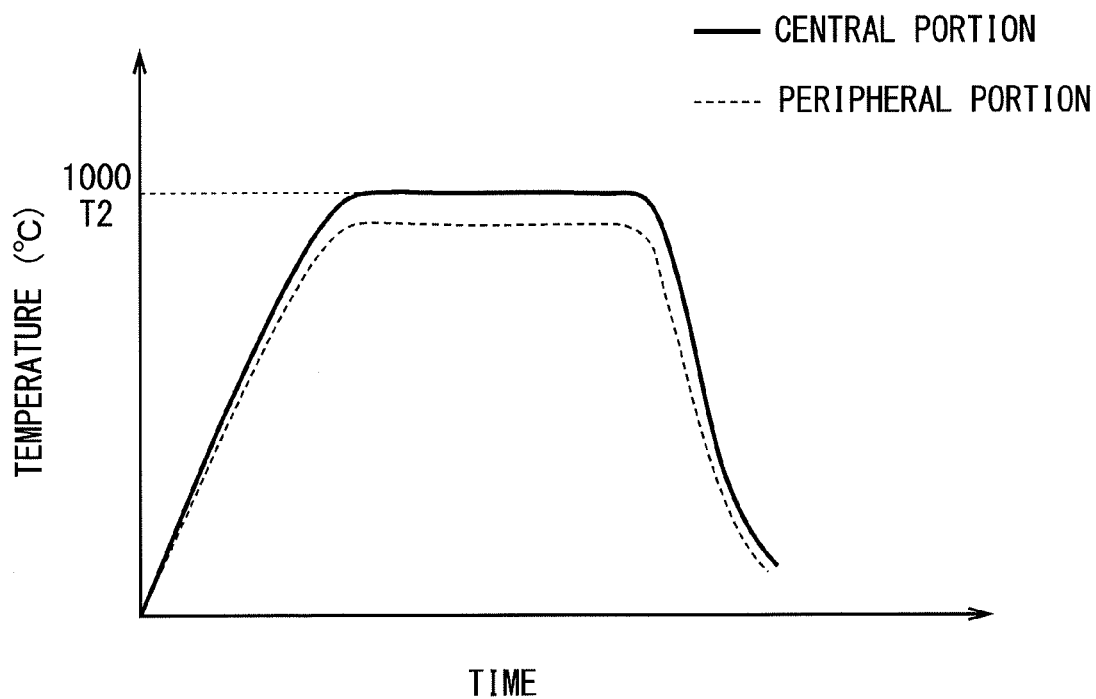
FIG. 11 is a graph showing changes in the temperature of the front surface of a semiconductor wafer when the current having the waveform of FIG. 10 flows through the flash lamps.

FIG. 11 is a graph showing changes in the temperature of the front surface of the semiconductor wafer W when the current having the waveform of FIG. 10 flows through the 30 flash lamps FL to cause light emission from the 30 flash lamps FL. In FIG. 11, the solid line denotes the temperature of the central portion of the front surface of the semiconductor wafer W, and the dotted line denotes the temperature of the peripheral portion of the front surface of the semiconductor wafer W. It should be noted that the graphs of FIGS. 10 and 11 are plotted with a time scale of milliseconds, whereas the graph of FIG. 9 is plotted with a time scale of seconds. Thus, the changes in temperature in FIG. 11 occur instantaneously at the time t2 of FIG. 9 (in other words, FIG. 11 is a graph showing the vicinity of the time t2 of FIG. 9 on an enlarged scale).

The waveform of current flowing through each flash lamp FL is generally similar to the light emission pattern of each flash lamp FL obtained when the current flows. That is, the current having the waveform as shown in FIG. 10 flows through each flash lamp FL, so that the light emission pattern of each flash lamp FL is that as shown in FIG. 10. The front surface of the semiconductor wafer W is heated by flash irradiation from the flash lamps FL which emit light in such a light emission pattern. The current having the waveform as shown in FIG. 10 flows through each flash lamp FL to thereby increase the temperature of the front surface of the semiconductor wafer W from the preheating temperature T1 to a treatment temperature T2. The temperature of the front surface of the semiconductor wafer W is maintained at the treatment temperature T2 for a short time, and thereafter starts decreasing from the treatment temperature T2. The treatment temperature T2 is in the range of 1000° C. to 1200° C. where the activation of the impurities is achieved, and shall be 1000° C. in the present preferred embodiment.

When the pulse signals having the same waveform are inputted to the 30 switching elements 96 at the same time and the currents flowing through the 30 flash lamps FL have the same waveform, there are cases where the temperature of the peripheral portion of the semiconductor wafer W is lower than the temperature of the central portion thereof, as shown in FIG. 11. Such a nonuniform in-plane temperature distribution of the semiconductor wafer W during the flash irradiation results in variations in characteristics of devices such as transistors manufactured from this semiconductor wafer W.

To overcome such a problem, the first preferred embodiment is configured to measure the in-plane temperature distribution of the semiconductor wafer W in the case where the currents flowing through the 30 flash lamps FL have the same waveform, thereby controlling the operations of the 30 switching elements 96, based on the result of measurement. Also, the charging voltages applied from the charging units 95 to the capacitors 93 are controlled, based on the result of measurement.

The control of the operations of the 30 switching elements 96 based on the result of measurement of the in-plane temperature distribution is of three types to be described below. The first type of the operation control is such that the controller 3 automatically sets the waveforms of the pulse signals to be outputted to the 30 switching elements 96, respectively, based on the result of measurement of the in-plane temperature distribution. Specifically, flash irradiation is performed on, for example, a test semiconductor wafer W under conditions where the currents flowing through the 30 flash lamps FL have the same waveform as described above. The temperature of the front surface of the semiconductor wafer W at that time is measured with the radiation thermometer 140 and the radiation thermometer 150. The radiation thermometer 140 measures the temperature of the peripheral portion of the semiconductor wafer W subjected to the flash heating. The radiation thermometer 150, on the other hand, measures the temperature of the central portion of the semiconductor wafer W subjected to the flash heating. The results of measurement with the radiation thermometer 140 and the radiation thermometer 150 are stored in a storage part (a memory or a magnetic disk) in the controller 3.

The waveform setting part 32 of the controller 3 sets the waveforms of the pulse signals to be outputted to the 30 switching elements 96, respectively, based on the results of measurement with the radiation thermometer 140 and the radiation thermometer 150. When the temperature of the peripheral portion of the semiconductor wafer W is lower than that of the central portion thereof, as shown in FIG. 11, that is, when the result of measurement with the radiation thermometer 140 is lower than the result of measurement with the radiation thermometer 150, the setting is made so that pulse signals to be outputted to switching elements 96 corresponding to some of the flash lamps FL which are in the vicinity of the edge portion of the arrangement of the 30 flash lamps FL have a relatively long ON time interval. Specifically, the waveform setting part 32 sets the waveforms of the pulse signals to be outputted to the respective switching elements 96 so that the ON time interval of the pulse signals to be outputted to the switching elements 96 corresponding to some of the flash lamps FL which are in the vicinity of the edge portion of the arrangement of the 30 flash lamps FL is longer than the ON time interval of pulse signals to be outputted to switching elements 96 corresponding to some of the flash lamps FL which are in the vicinity of the central portion of the arrangement.

Figure 12:
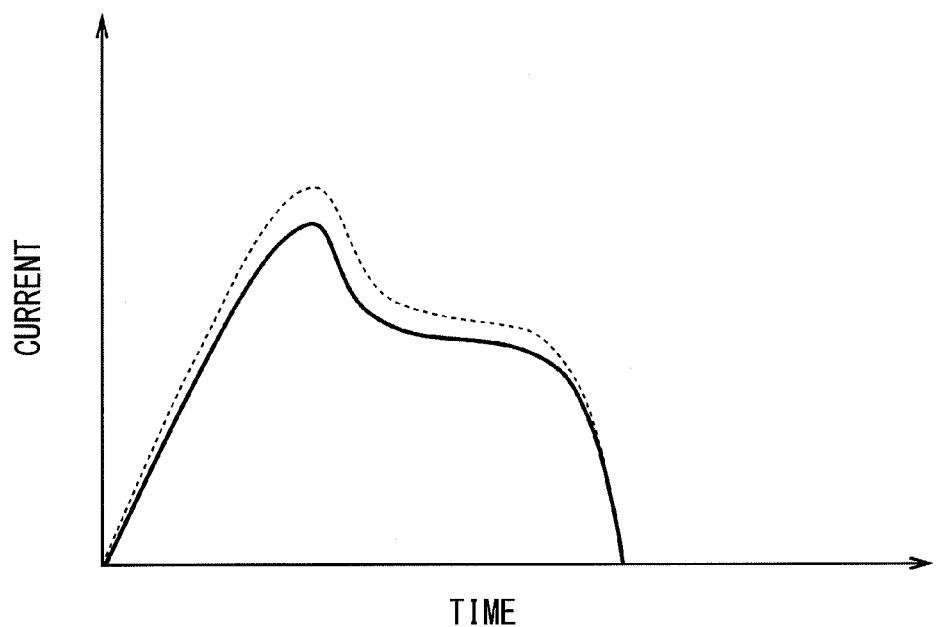
FIG. 12 is a graph showing another example of the waveform of current flowing through the flash lamps.

By inputting the pulse signals having the waveforms individually set in this manner to the 30 switching elements 96 respectively, the currents flowing through the 30 flash lamps FL have waveforms as shown in FIG. 12. In FIG. 12, the solid line denotes the waveform of current flowing through the flash lamps FL lying in the vicinity of the central portion of the arrangement of the 30 flash lamps FL, and the dotted line denotes the waveform of current flowing through the flash lamps FL lying in the vicinity of the edge portion thereof. As a result of causing the waveforms of the pulse signals inputted to the 30 switching elements 96 to differ in the aforementioned manner, the current flowing through the flash lamps FL lying in the vicinity of the edge portion of the arrangement of the 30 flash lamps FL is higher than the current flowing through the flash lamps FL lying in the vicinity of the central portion thereof. Accordingly, the light emission intensity of the flash lamps FL lying in the vicinity of the edge portion is higher than that of the flash lamps FL lying in the vicinity of the central portion.

Figure 13:
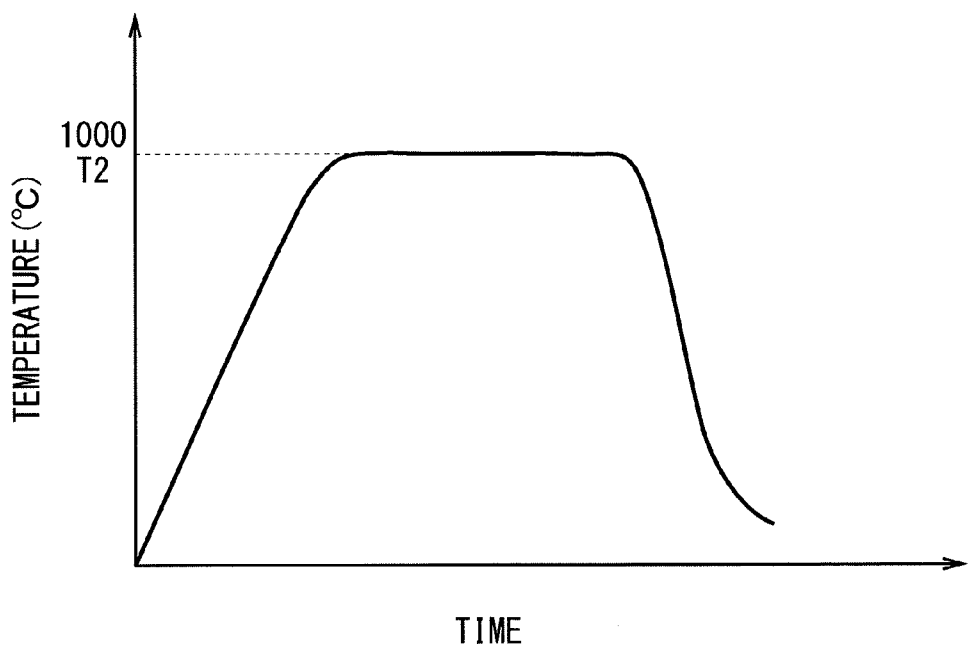
FIG. 13 is a graph showing changes in the temperature of the front surface of a semiconductor wafer when the current having the waveform of FIG. 12 flows through the flash lamps.

FIG. 13 is a graph showing changes in the temperature of the front surface of the semiconductor wafer W when the current having the waveform of FIG. 12 flows through the 30 flash lamps FL to cause light emission from the 30 flash lamps FL. The current having the waveform as shown in FIG. 12 flows through each flash lamp FL, so that the light emission pattern of each flash lamp FL is that as shown in FIG. 12. It should be noted that the light emission intensity of the flash lamps FL lying in the vicinity of the edge portion of the arrangement of the 30 flash lamps FL is higher than that of the flash lamps FL lying in the vicinity of the central portion thereof. The front surface of the semiconductor wafer W is heated by the flash irradiation from the 30 flash lamps FL which emit light in such a light emission pattern. The current having the waveform as shown in FIG. 12 flows through each flash lamp FL to thereby increase the temperature of the front surface of the semiconductor wafer W from the preheating temperature T1 to the treatment temperature T2. The temperature of the front surface of the semiconductor wafer W is maintained at the treatment temperature T2 for a short time, and thereafter starts decreasing from the treatment temperature T2.

In the example shown in FIG. 13, the light emission intensity of the flash lamps FL lying in the vicinity of the edge portion of the arrangement of the 30 flash lamps FL is higher than that of the flash lamps FL lying in the vicinity of the central portion thereof. This provides a higher illuminance in the peripheral portion of the semiconductor wafer W where a temperature decrease is prone to occur. As a result, the in-plane temperature distribution of the semiconductor wafer W during the flash irradiation is uniform. The uniform in-plane temperature distribution of the semiconductor wafer W during the flash irradiation provides uniform characteristics of devices manufactured from this semiconductor wafer W.

Next, the second type of the operation control of the switching elements 96 is such that an operator of the apparatus manually sets the waveforms of the pulse signals to be outputted to the 30 switching elements 96, respectively, based on the result of measurement of the in-plane temperature distribution. In this case, flash irradiation is performed on, for example, a test semiconductor wafer W under conditions where the currents flowing through the 30 flash lamps FL have the same waveform, as in the case of the first type. The temperature of the front surface of the semiconductor wafer W at that time is measured with the radiation thermometer 140 and the radiation thermometer 150. The radiation thermometer 140 measures the temperature of the peripheral portion of the semiconductor wafer W subjected to the flash heating. The radiation thermometer 150, on the other hand, measures the temperature of the central portion of the semiconductor wafer W subjected to the flash heating. The results of measurement with the radiation thermometer 140 and the radiation thermometer 150 are displayed on a display part (not shown) and the like in the heat treatment apparatus 1, for example.

The operator sets the waveforms of the pulse signals to be outputted to the 30 switching elements 96, respectively, based on the results of measurement with the radiation thermometer 140 and the radiation thermometer 150. The settings of the waveforms at this time are similar to those of the aforementioned first type. Specifically, the waveforms of the pulse signals to be outputted to the respective switching elements 96 are set so that the ON time interval of the pulse signals to be outputted to the switching elements 96 corresponding to the flash lamps FL lying in the vicinity of the edge portion of the arrangement of the 30 flash lamps FL is longer than the ON time interval of the pulse signals to be outputted to the switching elements 96 corresponding to the flash lamps FL lying in the vicinity of the central portion of the arrangement.

Parameters of the waveforms of the pulse signals set by the operator are inputted from the input part 33 to the controller 3. The waveform setting part 32 sets the pulse waveforms in accordance with the inputs to thereby cause the currents having the waveforms of FIG. 12 to flow through the 30 flash lamps FL, as in the case of the first type. This achieves the uniform in-plane temperature distribution of the semiconductor wafer W during the flash irradiation.

The third type of the operation control of the switching elements 96 is such that the controller 3 exercises feedback control of the 30 switching elements 96 in real time, based on the result of measurement of the in-plane temperature distribution. In this case, while the flash irradiation from the 30 flash lamps FL is performed on the semiconductor wafer W to be treated, the temperature of the front surface of the semiconductor wafer W at that time is measured with the radiation thermometer 140 and the radiation thermometer 150. The radiation thermometer 140 measures the temperature of the peripheral portion of the semiconductor wafer W subjected to the flash heating. The radiation thermometer 150, on the other hand, measures the temperature of the central portion of the semiconductor wafer W subjected to the flash heating. The results of measurement with the radiation thermometer 140 and the radiation thermometer 150 are transmitted to the controller 3.

The controller 3 makes a correction to the waveforms of the pulse signals being outputted to the 30 switching elements 96, respectively, based on the results of measurement with the radiation thermometer 140 and the radiation thermometer 150. When the temperature of the peripheral portion of the semiconductor wafer W is lower than the temperature of the central portion thereof, the controller 3 makes a correction to the waveforms of the pulse signals so that the pulse signals being outputted to the switching elements 96 corresponding to the flash lamps FL lying in the vicinity of the edge portion of the arrangement of the 30 flash lamps FL have a relatively long ON time interval. Specifically, the ON time interval of the pulse signals being outputted to the switching elements 96 corresponding to the flash lamps FL lying in the vicinity of the edge portion of the arrangement of the 30 flash lamps FL is made longer or the ON time interval of the pulse signals being outputted to the switching elements 96 corresponding to the flash lamps FL lying in the vicinity of the central portion of the arrangement is made shorter.

Thus, the currents flowing through the flash lamps FL lying in the vicinity of the edge portion of the arrangement of the 30 flash lamps FL is made relatively higher than the currents flowing through the flash lamps FL lying in the vicinity of the central portion thereof. Accordingly, the light emission intensity of the flash lamps FL lying in the vicinity of the edge portion is higher than that of the flash lamps. FL lying in the vicinity of the central portion. As a result, this provides a higher illuminance of a flash of light in the peripheral portion of the semiconductor wafer W where a temperature decrease has occurred to achieve the uniform in-plane temperature distribution of the semiconductor wafer W during the flash irradiation.

In the case of the third type, it can be supposed that the computation process cannot follow the aforementioned correction process, depending on the processing speed of the controller 3, because the time period for the light emission from the flash lamps FL is extremely short (not greater than one second, and in general several to tens of millimeters). In such a case, a plurality of patterns of the waveforms of the pulse signals to be outputted to the switching elements 96 are previously prepared and stored in the storage part of the controller 3. It is desirable that waveform patterns for temperature increase, waveform patterns for temperature maintenance and the like are prepared. The controller 3 may select an optimum waveform from the plurality of prepared patterns of the waveforms of the pulse signals, based on the results of measurement with the radiation thermometer 140 and the radiation thermometer 150. This enables the controller 3 to exercise the feedback control of the 30 switching elements 96 in real time in a shorter computation processing time.

In the first preferred embodiment, the controller 3 controls the charging voltages applied from the charging units 95 to the capacitors 93, respectively, based on the result of measurement of the in-plane temperature distribution of the semiconductor wafer W. The control of the charging voltages is of two types to be described below. The first type of the control of the charging voltages is such that the controller 3 automatically sets the charging voltages to the 30 capacitors 93, respectively, based on the result of measurement of the in-plane temperature distribution. In the aforementioned manner, flash irradiation is performed on, for example, a test semiconductor wafer W under conditions where the currents flowing through the 30 flash lamps FL have the same waveform. The temperature of the front surface of the semiconductor wafer W at that time is measured with the radiation thermometer 140 and the radiation thermometer 150. The radiation thermometer 140 measures the temperature of the peripheral portion of the semiconductor wafer W subjected to the flash heating. The radiation thermometer 150, on the other hand, measures the temperature of the central portion of the semiconductor wafer W subjected to the flash heating. The results of measurement with the radiation thermometer 140 and the radiation thermometer 150 are stored in the storage part in the controller 3.

The controller 3 sets the charging voltages to the 30 capacitors 93, respectively, based on the results of measurement with the radiation thermometer 140 and the radiation thermometer 150. When the temperature of the peripheral portion of the semiconductor wafer W is lower than the temperature of the central portion thereof, as shown in FIG. 11, that is, when the result of measurement with the radiation thermometer 140 is lower than the result of measurement with the radiation thermometer 150, the setting is made so that charging voltages to capacitors 93 corresponding to the flash lamps FL lying in the vicinity of the edge portion of the arrangement of the 30 flash lamps FL are relatively high. Specifically, the controller 3 sets the charging voltages to the respective capacitors 93 so that the charging voltages to the capacitors 93 corresponding to the flash lamps FL lying in the vicinity of the edge portion of the arrangement of the 30 flash lamps FL are higher than charging voltages to capacitors 93 corresponding to the flash lamps FL lying in the vicinity of the central portion of the arrangement.

The controller 3 controls the 30 charging units 95 so that the charging voltages individually set in this manner are used to charge the 30 capacitors 93. As a result of causing the charging voltages to the 30 capacitors 93 to differ in the aforementioned manner, the light emission intensity of the flash lamps FL lying in the vicinity of the edge portion of the arrangement of the 30 flash lamps FL is higher than that of the flash lamps FL lying in the vicinity of the central portion. As a result, this provides a higher illuminance of a flash of light in the peripheral portion of the semiconductor wafer W where a temperature decrease is prone to occur to achieve the uniform in-plane temperature distribution of the semiconductor wafer W during the flash irradiation.

The second type of the control of the charging voltages is such that an operator of the apparatus manually sets the charging voltages applied from the charging units 95 to the capacitors 93, respectively, based on the result of measurement of the in-plane temperature distribution. In this case, flash irradiation is performed on, for example, a test semiconductor wafer W under conditions where the currents flowing through the 30 flash lamps FL have the same waveform as described above, as in the case of the first type. The temperature of the front surface of the semiconductor wafer W at that time is measured with the radiation thermometer 140 and the radiation thermometer 150. The radiation thermometer 140 measures the temperature of the peripheral portion of the semiconductor wafer W subjected to the flash heating. The radiation thermometer 150, on the other hand, measures the temperature of the central portion of the semiconductor wafer W subjected to the flash heating. The results of measurement with the radiation thermometer 140 and the radiation thermometer 150 are displayed on the display part and the like in the heat treatment apparatus 1, for example.

The operator sets the charging voltages to the 30 capacitors 93, respectively, based on the results of measurement with the radiation thermometer 140 and the radiation thermometer 150. The settings of the voltages at this time are similar to those of the aforementioned first type. Specifically, the operator sets the charging voltages to the respective capacitors 93 so that the charging voltages to the capacitors 93 corresponding to the flash lamps FL lying in the vicinity of the edge portion of the arrangement of the 30 flash lamps FL are higher than the charging voltages to the capacitors 93 corresponding to the flash lamps FL lying in the vicinity of the central portion of the arrangement.

The set values of the charging voltages set by the operator are inputted from the input part 33 to the controller 3. The controller 3 controls the charging units 95 to charge the capacitors 93 in accordance with the inputs, whereby the light emission intensity of the flash lamps FL lying in the vicinity of the edge portion of the arrangement of the 30 flash lamps FL is higher than that of the flash lamps FL lying in the vicinity of the central portion. As a result, this provides a higher illuminance of a flash of light in the peripheral portion of the semiconductor wafer W where a temperature decrease is prone to occur to achieve the uniform in-plane temperature distribution of the semiconductor wafer W during the flash irradiation.

In the first preferred embodiment as described above, the 30 switching elements 96 are provided in a one-to-one correspondence with the 30 flash lamps FL, and the controller 3 individually controls the operations of the 30 switching elements 96 to individually define the light emission patterns of the 30 flash lamps FL. In the first preferred embodiment, the radiation thermometer 140 and the radiation thermometer 150 are provided to measure the in-plane temperature distribution of the semiconductor wafer W, and the controller 3 individually controls the operations of the 30 switching elements 96, based on the results of measurement with the radiation thermometer 140 and the radiation thermometer 150. Also, the controller 3 individually controls the charging voltages applied from the charging units 95 to the capacitors 93, based on the results of measurement with the radiation thermometer 140 and the radiation thermometer 150. The individual control of the light emission patterns of the plurality of flash lamps FL and the charging voltages to the plurality of capacitors 93 corresponding to the plurality of flash lamps FL makes the illuminance of a flash of light relatively high in a region of the semiconductor wafer W where a temperature decrease is prone to occur to achieve the uniform in-plane temperature distribution of the semiconductor wafer W during the flash irradiation.

Referring again to FIG. 9, the halogen lamps HL turn off at time t3 which is a predetermined time period later than the time at which the flash irradiation is completed and the light emission from the flash lamps FL is stopped. This causes the temperature of the semiconductor wafer W to start decreasing from the preheating temperature T1. After the temperature of the semiconductor wafer W is decreased to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Second Preferred Embodiment

Next, a second preferred embodiment according to the present invention will be described. A heat treatment apparatus according to the second preferred embodiment is exactly identical in configuration with that according to the first preferred embodiment. A procedure for the treatment of a semiconductor wafer W according to the second preferred embodiment is generally similar to that according to the first preferred embodiment. The operations of the switching elements 96 and the charging voltages to the capacitors 93 are controlled in the first preferred embodiment, based on the result of measurement of the in-plane temperature distribution of the semiconductor wafer W. In the second preferred embodiment, similar control is exercised based on the result of measurement of an illuminance distribution of the arrangement of the 30 flash lamps FL. Specifically, the controller 3 controls the operations of the 30 switching elements 96 and the charging voltages applied from the charging units 95 to the capacitors 93, based on the results of measurement with the illuminance sensor 240 and the illuminance sensor 250.

As in the first preferred embodiment, the control of the operations of the 30 switching elements 96 based on the result of measurement of the illuminance distribution is of three types to be described below. The first type of the operation control is such that the controller 3 automatically sets the waveforms of the pulse signals to be outputted to the 30 switching elements 96, respectively, based on the result of measurement of the illuminance distribution. The illuminance of the arrangement of the flash lamps FL is measured with the illuminance sensor 240 and the illuminance sensor 250 when a flash of light is emitted from the 30 flash lamps FL. The illuminance sensor 240 measures the illuminance in the vicinity of the edge portion of the arrangement of the 30 flash lamps FL. The illuminance sensor 250, on the other hand, measures the illuminance in the vicinity of the central portion of the arrangement of the 30 flash lamps FL.

The waveform setting part 32 of the controller 3 sets the waveforms of the pulse signals to be outputted to the 30 switching elements 96, respectively, based on the results of measurement with the illuminance sensor 240 and the illuminance sensor 250. When the illuminance in the central portion of the arrangement of the 30 flash lamps FL is lower than the illuminance in the edge portion thereof, that is, when the result of measurement with the illuminance sensor 250 is lower than the result of measurement with the illuminance sensor 240, the setting is made so that the pulse signals to be outputted to the switching elements 96 corresponding to the flash lamps FL lying in the vicinity of the central portion of the arrangement of the 30 flash lamps FL have a relatively long ON time interval. Specifically, the waveform setting part 32 sets the waveforms of the pulse signals to be outputted to the respective switching elements 96 so that the ON time interval of the pulse signals to be outputted to the switching elements 96 corresponding to the flash lamps FL lying in the vicinity of the central portion of the arrangement of the 30 flash lamps FL is longer than the ON time interval of the pulse signals to be outputted to the switching elements 96 corresponding to the flash lamps FL lying in the vicinity of the edge portion of the arrangement.

This provides a uniform illuminance distribution at the surface of the arrangement of the 30 flash lamps FL to consequently achieve the uniform in-plane temperature distribution of the semiconductor wafer W during the flash irradiation.

The second type of the operation control of the switching elements 96 is such that an operator of the apparatus manually sets the waveforms of the pulse signals to be outputted to the 30 switching elements 96, respectively, based on the result of measurement of the illuminance distribution. In place of the controller 3, the operator sets the waveforms of the pulse signals, based on the result of measurement of the illuminance distribution, as in the case of the second type of the operation control of the switching elements 96 in the first preferred embodiment. The settings of the waveforms at this time are similar to those of the aforementioned first type.

The third type of the operation control of the switching elements 96 is such that the controller 3 exercises feedback control of the 30 switching elements 96 in real time, based on the result of measurement of the illuminance distribution. The controller 3 makes a correction to the waveforms of the pulse signals being outputted to the 30 switching elements 96, respectively, based on the results of measurement with the illuminance sensor 240 and the illuminance sensor 250, as in the case of the third type of the operation control of the switching elements 96 in the first preferred embodiment. For example, when the illuminance in the central portion of the arrangement of the 30 flash lamps FL is lower than the illuminance in the edge portion thereof, the controller 3 makes a correction to the waveforms of the pulse signals so that pulse signals being outputted to the switching elements 96 corresponding to the flash lamps FL lying in the vicinity of the central portion of the arrangement of the 30 flash lamps FL have a relatively long ON time interval. This provides a uniform illuminance distribution at the surface of the arrangement of the 30 flash lamps FL to consequently achieve the uniform in-plane temperature distribution of the semiconductor wafer W during the flash irradiation.

In the second preferred embodiment, the controller 3 controls the charging voltages applied from the charging units 95 to the capacitors 93, respectively, based on the result of measurement of the illuminance distribution of the arrangement of the 30 flash lamps FL. As in the first preferred embodiment, the control of the charging voltages is of two types to be described below. The first type of the control of the charging voltages is such that the controller 3 automatically sets the charging voltages to the 30 capacitors 93, respectively, based on the result of measurement of the illuminance distribution. In the aforementioned manner, the illuminance of the arrangement of the flash lamps FL is measured with the illuminance sensor 240 and the illuminance sensor 250 when a flash of light is emitted from the 30 flash lamps FL.

The controller 3 sets the charging voltages to the 30 capacitors 93, respectively, based on the results of measurement with the illuminance sensor 240 and the illuminance sensor 250. When the result of measurement with the illuminance sensor 240 is lower than the result of measurement with the illuminance sensor 250, the setting is made so that the charging voltages to the capacitors 93 corresponding to the flash lamps FL in the vicinity of the edge portion of the arrangement of the 30 flash lamps FL are relatively high. Specifically, the controller 3 sets the charging voltages to the capacitors 93 so that the charging voltages to the capacitors 93 corresponding to the flash lamps FL lying in the vicinity of the edge portion of the arrangement of the 30 flash lamps FL are higher than the charging voltages to capacitors 93 corresponding to the flash lamps FL lying in the vicinity of the central portion of the arrangement.

The controller 3 controls the 30 charging units 95 so that the charging voltages individually set in this manner are used to charge the 30 capacitors 93. As a result of causing the charging voltages to the 30 capacitors 93 to differ in the aforementioned manner, the illuminance distribution at the surface of the arrangement of the 30 flash lamps FL is uniform. This achieves the uniform in-plane temperature distribution of the semiconductor wafer W during the flash irradiation.

The second type of the control of the charging voltages is such that an operator of the apparatus manually sets the charging voltages applied from the charging units 95 to the capacitors 93, respectively, based on the result of measurement of the illuminance distribution. In place of the controller 3, the operator sets the charging voltages to the 30 capacitors 93, based on the result of measurement of the illuminance distribution, as in the case of the second type of the control of the charging voltages in the first preferred embodiment. The settings of the voltages are similar to those of the aforementioned first type.

In the second preferred embodiment as described above, the 30 switching elements 96 are provided in a one-to-one correspondence with the 30 flash lamps, and the controller 3 individually controls the operations of the 30 switching elements 96 to individually define the light emission patterns of the 30 flash lamps FL. In the second preferred embodiment, the illuminance sensor 240 and the illuminance sensor 250 are provided to measure the illuminance distribution of the arrangement of the 30 flash lamps FL, and the controller 3 individually controls the operations of the 30 switching elements 96, based on the results of measurement with the illuminance sensor 240 and the illuminance sensor 250. Also, the controller 3 individually controls the charging voltages applied from the charging units 95 to the capacitors 93, based on the results of measurement with the illuminance sensor 240 and the illuminance sensor 250. The individual control of the light emission patterns of the plurality of flash lamps FL and the charging voltages to the plurality of capacitors 93 corresponding to the plurality of flash lamps FL makes the illuminance distribution at the surface of the arrangement of the flash lamps FL uniform. As a result, this achieves the uniform in-plane temperature distribution of the semiconductor wafer W during the flash irradiation.

Modifications

While the preferred embodiments according to the present invention have been described hereinabove, various modifications of the present invention in addition to those described above may be made without departing from the scope and spirit of the invention. For example, the controller 3 individually controls the operations of the 30 switching elements 96 to individually define the light emission patterns of the 30 flash lamps FL in the aforementioned preferred embodiments. However, the 30 flash lamps FL may be divided into a plurality of lamp groups, so that control is exercised on a zone-by-zone basis.

Figure 14:
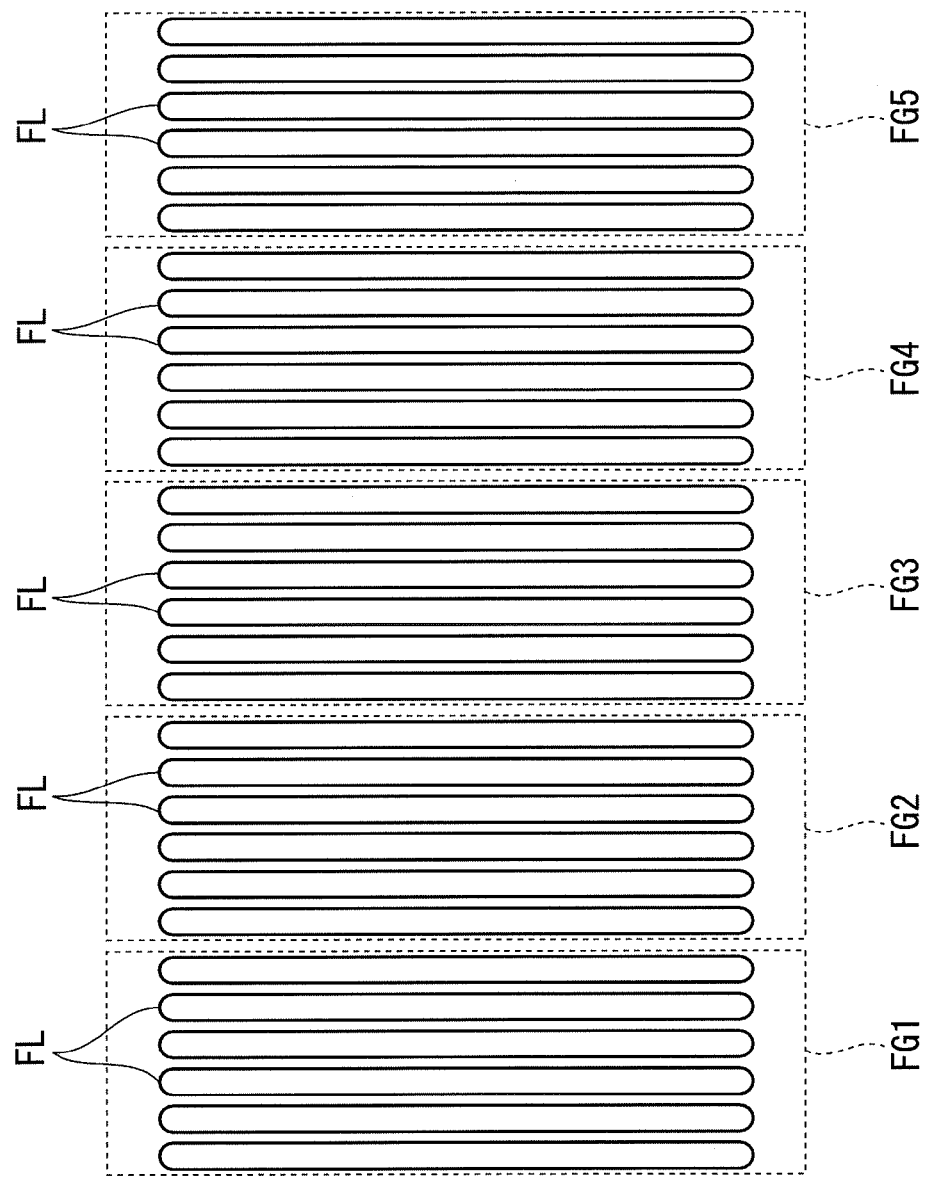
FIG. 14 is a view showing an example of the flash lamps divided into a plurality of flash lamp groups.

FIG. 14 is a view showing an example of the 30 flash lamps FL divided into a plurality of flash lamp groups. In the example of FIG. 14, the 30 flash lamps FL are divided into five flash lamp groups. Specifically, the arrangement of the 30 flash lamps FL is divided into five: a flash lamp group FG3 in a central zone, flash lamp groups FG1 and FG5 in opposite end zones, and flash lamp groups FG2 and FG4 in intermediate zones between the central and opposite end zones. Each of the five flash lamp groups FG1, FG2, FG3, FG4 and FG5 includes six flash lamps FL. The controller 3 outputs pulse signals having the same waveform at the same time to six switching elements 96 corresponding to the six flash lamps FL included in each of the five flash lamp groups FG1, FG2, FG3, FG4 and FG5. Thus, the six flash lamps FL included in each flash lamp group have the same light emission pattern. This allows the controller 3 to control the operation of the switching elements 96 for each flash lamp group, thereby defining the light emission pattern for each flash lamp group.

On the other hand, the controller 3 in the first and second preferred embodiments individually controls the operations of the 30 switching elements 96 to individually define the light emission patterns of the 30 flash lamps FL. Thus, the pulse signals having different pulse waveforms may be outputted to all of the 30 switching elements 96, so that all of the 30 flash lamps FL have different light emission patterns.

In summary, the controller 3 is required only to individually control the operations of the 30 switching elements 96 so that some of the flash lamps FL corresponding to a region of the semiconductor wafer W where a temperature decrease occurs during flash irradiation or a region of the arrangement of the flash lamps FL where an illuminance decrease occurs have a relatively high illuminance.

In the first and second preferred embodiments, the controller 3 controls both the operations of the 30 switching elements 96 and the charging voltages applied from the charging units 95 to the capacitors 93. However, the controller 3 may control only either the operations of the 30 switching elements 96 or the charging voltages. Changing the charging voltages causes changes in the shapes of the waveforms of currents flowing through the flash lamps FL to result in difficulties in controlling the light emission patterns of the flash lamps FL. It is hence preferable that the controller 3 exercises at least the individual operation control of the 30 switching elements 96.

Also, in the aforementioned preferred embodiments, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Further, although the voltage is applied to the trigger electrode 91 in synchronism with the turning on of the pulse signal in the aforementioned preferred embodiments, the timing of the application of the trigger voltage is not limited to this. The trigger voltage may be applied at fixed time intervals independently of the waveform of the pulse signal. In a case where the pulse signal is short in time intervals or where the passage of current is started by a pulse while the value of the current caused to flow through the flash lamp FL by the preceding pulse is not less than a predetermined value, the current continues to flow through the flash lamp FL without interruption. In such a case, it is not necessary to apply the trigger voltage for each pulse. In other words, the timing of the application of the trigger voltage may be arbitrarily determined as long as the timing of the current flow through the flash lamp FL coincides with the turning on of the pulse signal.

Although an IGBT is used as each of the switching elements 96 in the aforementioned preferred embodiments, another transistor capable of turning on and off the circuit in accordance with the signal level inputted to the gate thereof may be used in place of the IGBT. It is, however, preferable to use an IGBT and a GTO (gate turn-off) thyristor which are suitable for handling high power as each of the switching elements 96 because the emission of light from the flash lamps FL consumes considerably high power.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with a flash of light, comprising:
   a chamber for receiving a substrate therein;
   a holder for holding the substrate in said chamber;
   a plurality of flash lamps for irradiating the substrate held by said holder with a flash of light;
   a plurality of switching elements provided in a one-to-one correspondence with said flash lamps and each defining the waveform of current flowing through a corresponding one of said flash lamps; and
   a light emission controller for individually controlling the operations of said switching elements to individually define the light emission patterns of said flash lamps;
   further comprising a plurality of illuminance sensors for measuring the illuminances of different regions, respectively, of the arrangement of said flash lamps, wherein
   said light emission controller controls the operations of said switching elements, based on results of measurement with said illuminance sensors.

2. The heat treatment apparatus according to claim 1, further comprising:
   a plurality of capacitors provided in a one-to-one correspondence with said flash lamps and each supplying electrical charge to a corresponding one of said flash lamps; and
   a plurality of charging parts provided in a one-to-one correspondence with said capacitors and charging said capacitors with individual voltages, and
   wherein said light emission controller controls the charging voltages of said charging parts individually, based on results of measurement with said illuminance sensors.

3. A method of heating a substrate by irradiating the substrate with a flash of light, the method comprising the step of
   individually controlling the operations of a plurality of switching elements provided in a one-to-one correspondence with a plurality of flash lamps for emitting a flash of light and each defining the waveform of current flowing through a corresponding one of said flash lamps, to individually define the light emission patterns of said flash lamps, wherein the operations of said switching elements are controlled, based on results of measurement of illuminances of different regions, respectively, of the arrangement of said flash lamps.

4. The method according to claim 3, wherein charging voltages to a plurality of capacitors provided in a one-to-one correspondence with said flash lamps and each supplying electrical charge to a corresponding one of said flash lamps are individually controlled, based on said results of measurement of the illuminances.

* * * * *